(12) United States Patent
Walline et al.

(10) Patent No.: US 8,174,410 B2
(45) Date of Patent: May 8, 2012

(54) ULTRA MOBILE KEYBOARD

(75) Inventors: Erin K. Walline, Pflugerville, TX (US);
Michael E. Smith, Austin, TX (US);
Justin Lyles, San Diego, CA (US)

(73) Assignee: Dell Products L.P., Round Rock, TX (US)

( * ) Notice: Subject to any disclaimer, the term of this patent is extended or adjusted under 35 U.S.C. 154(b) by 784 days.

(21) Appl. No.: 12/355,096

(22) Filed: Jan. 16, 2009

(65) Prior Publication Data

US 2010/0182169 A1 Jul. 22, 2010

(51) Int. Cl.
*H03M 11/00* (2006.01)
(52) U.S. Cl. .............. 341/23; 341/20; 341/22; 708/145; 708/146; 708/142; 345/168
(58) Field of Classification Search .................... 341/20, 341/22, 23; 708/145, 146, 142; 345/168
See application file for complete search history.

(56) References Cited

U.S. PATENT DOCUMENTS

| 5,117,455 | A | * | 5/1992 | Danish | 379/368 |
| 5,181,029 | A | * | 1/1993 | Kim | 341/20 |
| 5,383,141 | A | * | 1/1995 | Lapeyre | 708/146 |
| 5,717,431 | A | | 2/1998 | Chia-Ying et al. | |
| 6,046,728 | A | | 4/2000 | Hume et al. | |
| 6,130,628 | A | * | 10/2000 | Schneider-Hufschmidt et al. | 341/26 |
| 6,268,806 | B1 | | 7/2001 | Frager et al. | |
| 6,462,937 | B1 | | 10/2002 | Liao et al. | |
| 6,559,228 | B2 | * | 5/2003 | Kim et al. | 525/60 |
| 6,724,365 | B1 | | 4/2004 | Escamilla et al. | |

* cited by examiner

*Primary Examiner* — Albert Wong
(74) *Attorney, Agent, or Firm* — Hamilton & Terrile, LLP; Stephen A. Terrile

(57) ABSTRACT

An improved keyboard layout for use with information handling systems such as ultra mobile information handling systems. The improved keyboard layout eliminates the numbered function key (F1-F12) row and maps all of the functions that have traditionally been function (Fn) options on the F1-F12 row (such as brightness, volume, battery meter, etc.) to other keys.

12 Claims, 3 Drawing Sheets

ULTRA MOBILE KEYBOARD

BACKGROUND OF THE INVENTION

1. Field of the Invention

The present invention relates to the field of information handling systems and more particularly to keyboards for use with ultra mobile type information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems and in particular ultra mobile information handling systems (also known as subnotebook information handling systems) have made considerable gains in both popularity and technical sophistication. Portable, battery-powered information handling systems have become increasingly popular over the last several years due to their light weight and small size that permit them to be easily hand-carried in an ordinary briefcase and used by business travelers in cramped spaces, such as on airline seat back trays, lacking electrical plug-in facilities. One factor contributing to the increasing popularity of the notebook information handling system is its ever-decreasing size and weight, a factor arising from the ability to fabricate various components of the information handling system in smaller and smaller sizes while, in many cases, increasing the operating speed and decreasing the power utilization requirements of such components. For purposes of this discussion, "portable" and "notebook" are synonymous terms.

A portable information handling system typically incorporates both hard and floppy disk drives, a monitor screen built into its lid portion, and a keyboard built into its main body portion. It is thus a fully self-contained information handling system able to be used in situations and locations in which the use of a much larger desktop information handling system is simply not feasible. While portable information handling systems were at one time often employed as an adjunct to a primary desktop information handling system, the increased power of such information handling systems has allowed them to become many users' primary information handling systems.

One issue in the design of notebook information handling systems, however, is the keyboard structure. This design challenge has, to this point, arisen from two conflicting design goals: a desire to reduce the size of the keyboard structure and a desirability of having the notebook information handling system emulate as closely as possible the size and typing feel of a desktop type information handling system keyboard. The size of the typical human hand is an example of a driving force behind the latter of the two requirements, substantially limiting the amount of miniaturization that can be wrought.

For example, referring to FIG. 1, labeled prior art, a known keyboard layout is shown. This keyboard layout includes dedicated function keys as well as actuatable function keys which are actuated by pressing the key in combination with the Function (Fn) keys. The dedicated function keys often generate a fixed, single byte code, usually outside of a normal ASCII range, which is translated into some other configurable sequence by a keyboard device driver or interpreted directly by an application program. The dedicated function keys include respective "F-number" designations (e.g., F1). The actuatable function keys are accessed by a combination of pressing a function access key (Fn) simultaneously with pressing of an actuable function key (often indicated at Fn+F#). For example, the action of Fn+F8 may activate a volume decrease function.

The keyboard also includes a keyboard control which enables accessing BIOS and boot menus via the dedicated function keys during boot up of the system.

SUMMARY OF THE INVENTION

In accordance with the present invention, an improved keyboard layout for use with information handling systems such as ultra mobile information handling systems is set forth. More specifically, the improved keyboard layout eliminates the numbered function key (F1-F12) row and maps all of the functions that have traditionally been function (Fn) options on the F1-F12 row (such as brightness, volume, battery meter, etc.) to other keys. In certain embodiments, these functions are mapped to the number row of the keyboard. Such a keyboard layout allows a keyboard design which optimizes key pitch in the alpha region of the keyboard to be close to a full-size pitch (e.g., a full-size pitch substantially corresponds to a distance of 19.05 mm key center to key center ±1.0 mm as defined by the ISO 9241 standard) given the overall size constraints of the portable information handling system. The improved keyboard layout also balances the tradeoffs in size and placement of other keys while assuring the basic familiarity with the alpha touch-typing region isn't modified too drastically from a traditional keyboard layout. E.g., making sure that B key is centered under the G and H keys.

Additionally, in certain embodiments, the keyboard controller includes a modified method for accessing BIOS and boot menus so that a user is instructed to actuate a different key to access BIOS. Additionally, in certain embodiments, the improved keyboard layout includes a mapping of the function keys to the ASDF row of the keyboard. Additionally, in certain embodiments, the improved keyboard layout removes the embedded numpad and NunLock functions from the keyboard layout. Additionally, in certain embodiments, certain lesser used keys are repurposed as Function options on other keys. Examples of these lesser used keys include the {, }, [, ], |, \, ~, and ' keys.

Additionally, in certain embodiments, to maintain a large "Enter" key while maintaining the sizing of the alpha keycaps, the ' key is repositioned to the bottom row of the keyboard layout. This design consideration is based upon the belief that traditionally large surface area keys such as Enter are hit with less intentional accuracy due to their location (along the side of the keyboard) and size (i.e., users reach out to hit large surface area keys with less target accuracy because the larger size affords this behavior). In certain other embodiments, the improved keyboard layout includes a reduced size Enter key (e.g., to half-size) along with a ' key positioned in the traditional location.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
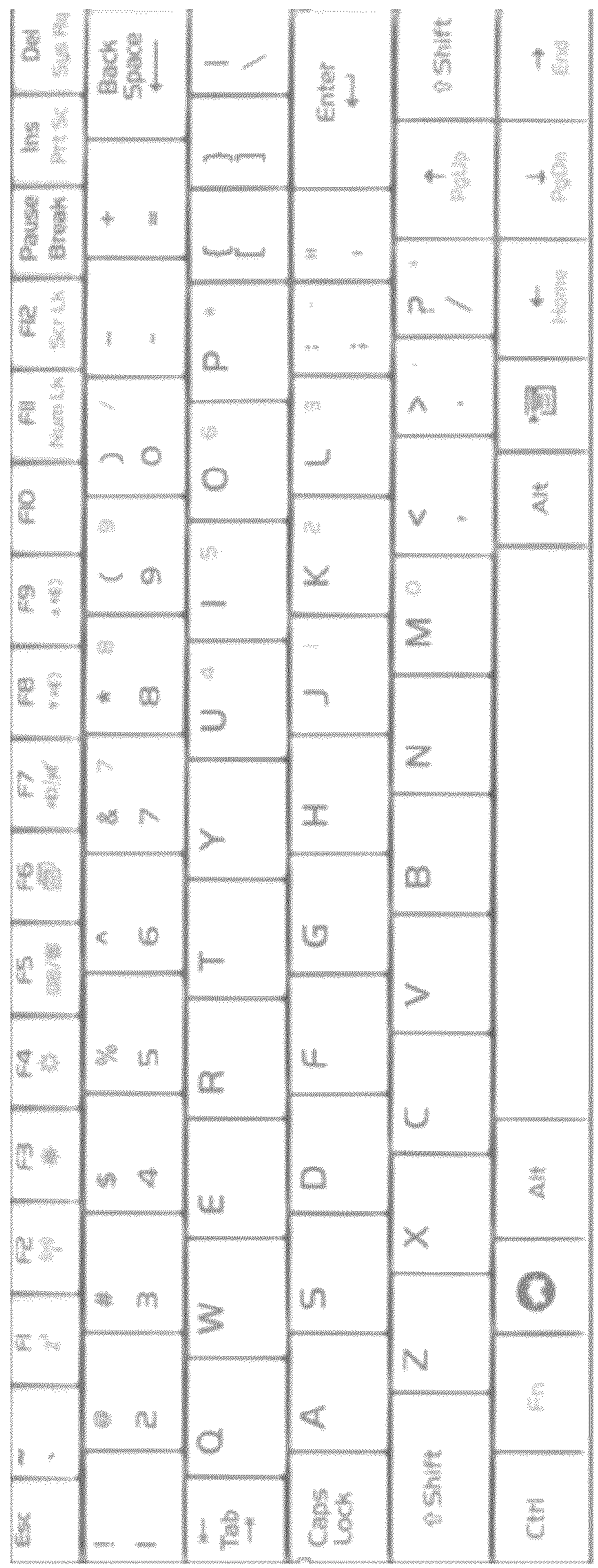
FIG. 1, labeled Prior Art, shows a traditional keyboard layout.
Figure 2:
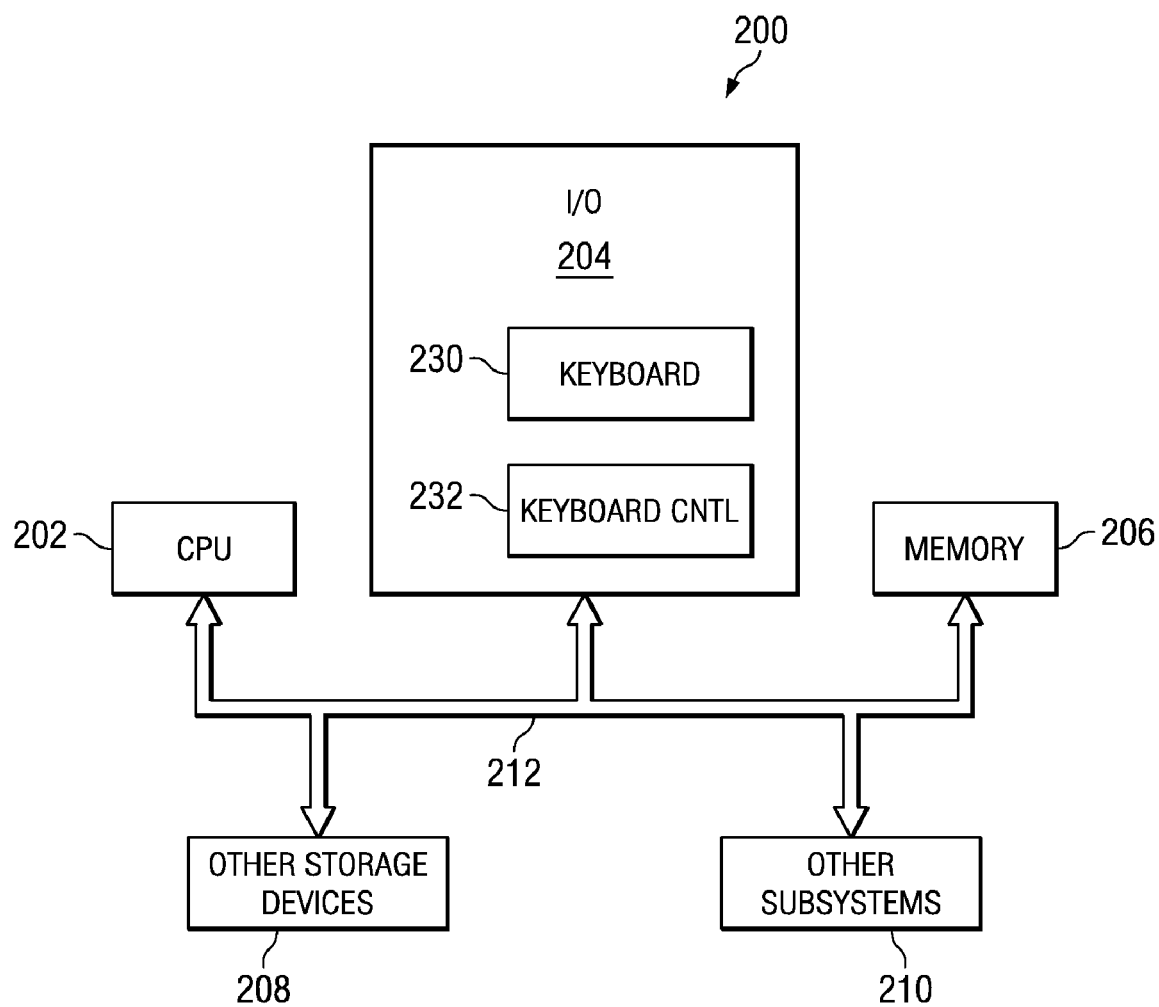
FIG. 2 shows an information handling system having an improved keyboard layout.

Referring briefly to FIG. 2, a system block diagram of an information handling system 200. The information handling system 200 includes a processor 202 (i.e., a central processing unit (CPU)), input/output (I/O) devices 204, such as a display, a keyboard, a mouse, and associated controllers, memory 206 including both non volatile memory and volatile memory, and other storage devices 208, such as a optical disk and drive and other memory devices, and various other subsystems 210, all interconnected via one or more buses 212.

The keyboard 230 includes an improved keyboard layout that is particularly useful for use with information handling systems such as ultra mobile information handling systems is set forth. Additionally, in certain embodiments, the keyboard controller 232 includes a modified method for accessing BIOS and boot menus so that a user is instructed to actuate a different key to access BIOS.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 3:
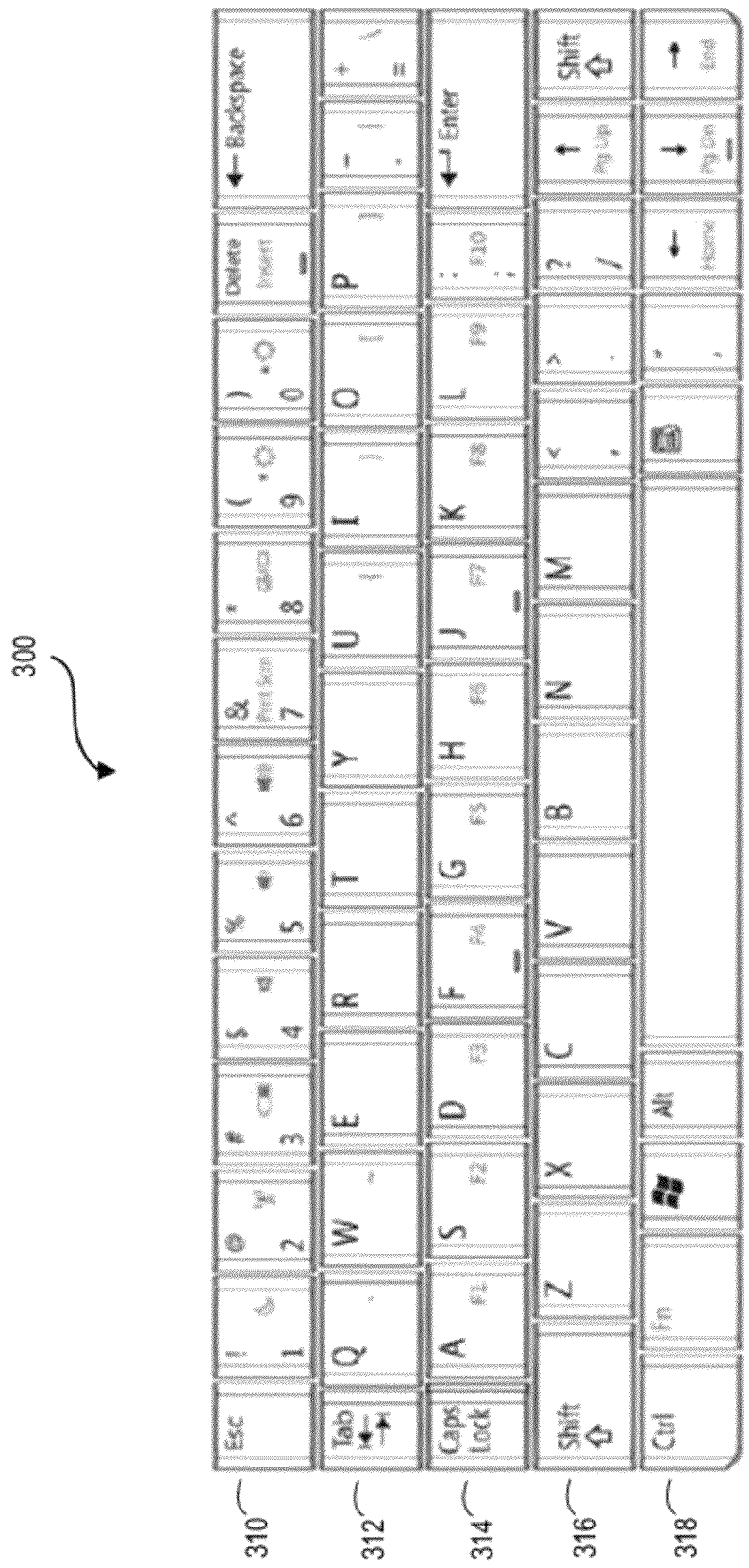
FIG. 3 shows a conceptual diagram of an improved keyboard layout.

Referring to FIG. 3, a conceptual diagram of an improved keyboard layout 300 is shown. The improved keyboard layout 300 eliminates the numbered function key (F1-F12) row and maps all of the functions that have traditionally been function (Fn) options on the F1-F12 row (such as brightness, volume, battery meter, etc.) to other keys.

More specifically, the improved keyboard layout 300 includes a plurality of keys arranged in a plurality of rows to provide a keyboard layout. The plurality of rows includes a number row 310, a first letter row 312, a second letter row 314, a third letter row 316 and a bottom row 318. The number row 310 includes a plurality of number keys. The first letter row 312 includes a first plurality of letter keys. The second letter row 314 includes a second plurality of letter keys. The third letter row 316 includes a third plurality of letter keys. The bottom row 318 includes a plurality of control keys.

At least some of the plurality of number keys include associated actuatable functions. The associated actuatable functions are actuatable by a combination of pressing the number key in combination with pressing a function key. At least some of the first plurality of letter keys, the second plurality of letter keys and the third plurality of letter keys comprising associated function keys, the associated function keys being actuatable by a combination of pressing the number key in combination with pressing a function key.

In certain embodiments, the numbered function keys are mapped to the number row 310 of the keyboard. Such a keyboard layout allows a keyboard design which optimizes key pitch in the alpha region of the keyboard to be close to a full-size pitch given the overall size constraints of the portable information handling system. A full-size pitch is generally considered to be defined by the ISO 9241 standard which sets forth a pitch substantially corresponding to a distance of 19.05 mm key center to key center +/−1.0 mm).

The improved keyboard layout also balances the tradeoffs in size and placement of other keys while assuring the basic familiarity with the alpha touch-typing region isn't modified too drastically from a traditional keyboard layout. E.g., making sure that B key 320 is centered under the G key 322 and H key 324.

Additionally, in certain embodiments, the improved keyboard layout includes a mapping of the function keys to the ASDF row 330 of the keyboard. Additionally, in certain embodiments, the improved keyboard layout removes the embedded numpad and NumLock functions from the keyboard layout. Additionally, in certain embodiments, certain lesser used keys are repurposed as Function options on other keys such as the QWER row 340. Examples of these lesser used keys include the { key, the } key, the [ key, the ] key, the | key, the \ key, the ~ key, and the ' key.

Additionally, in certain embodiments, to maintain a large Enter key 350 while maintaining the sizing of the alpha keycaps, the ' key 352 is repositioned to the bottom row 360 of the keyboard layout. This design consideration is based upon the belief that traditionally large surface area keys such as Enter are hit with less intentional accuracy due to their location (along the side of the keyboard) and size.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

For example, other layout changes are contemplated. For example, in certain other embodiments, the improved keyboard layout includes a reduced size Enter key (e.g., to half-size) along with a ' key positioned in the traditional location.

Consequently, the invention is intended to be limited only by the spirit and scope of the appended claims, giving full cognizance to equivalents in all respects.

What is claimed is:

1. A keyboard comprising:
a plurality of keys arranged in a plurality of rows to provide a keyboard layout, the plurality of rows comprising:
a number row, a first letter row, a second letter row, a third letter row and a bottom row,
the number row comprising a plurality of number keys, at least some of the plurality of number keys comprising associated actuatable functions, the associated actuatable functions being actuatable by a combination of pressing the number key in combination with pressing a function key,
the first letter row comprising a first plurality of letter keys,
the second letter row comprising a second plurality of letter keys,
the third letter row comprising a third plurality of letter keys,
at least some of the first plurality of letter keys, the second plurality of letter keys and the third plurality of letter keys comprising associated numbered functions, the associated numbered functions being actuatable by a combination of pressing an associated letter key in combination with pressing the function key.

2. The keyboard of claim 1 wherein
the second letter row further comprises an enter key, the enter key have a width corresponding to substantially two to three letter key widths.

3. The keyboard of claim 1 wherein
the second letter row comprises associated function key corresponding to functions identified as F1-F10.

4. The keyboard of claim 1 wherein
the third letter row comprises associated function key corresponding to functions identified as F11 and F12.

5. The keyboard of claim 1 wherein
at least some of the first plurality of letter keys comprise associated less used character keys, the less used character keys being actuatable by a combination of pressing an associated letter key in combination with pressing a function key.

6. The keyboard of claim 1 wherein
the bottom row comprises the function key.

7. An information handling system comprising:
a processor;
memory coupled to the processor;
a keyboard coupled to the processor, the keyboard comprising
a plurality of keys arranged in a plurality of rows to provide a keyboard layout, the plurality of rows comprising:
a number row, a first letter row, a second letter row, a third letter row and a bottom row,
the number row comprising a plurality of number keys, at least some of the plurality of number keys comprising associated actuatable functions, the associated actuatable functions being actuatable by a combination of pressing the number key in combination with pressing a function key,
the first letter row comprising a first plurality of letter keys,
the second letter row comprising a second plurality of letter keys,
the third letter row comprising a third plurality of letter keys,
at least some of the first plurality of letter keys, the second plurality of letter keys and the third plurality of letter keys comprising associated numbered functions, the associated numbered functions being actuatable by a combination of pressing an associated letter key in combination with pressing the function key.

8. The information handling system of claim 7 wherein
the second letter row further comprises an enter key, the enter key have a width corresponding to substantially two to three letter key widths.

9. The information handling system of claim 7 wherein
the second letter row comprises associated function key corresponding to functions identified as F1-F10.

10. The information handling system of claim 7 wherein
the third letter row comprises associated function key corresponding to functions identified as F11 and F12.

11. The information handling system of claim 7 wherein
at least some of the first plurality of letter keys comprise associated less used character keys, the less used character keys being actuatable by a combination of pressing an associated letter key in combination with pressing a function key.

12. The information handling system of claim 7 wherein
the bottom row comprises the function key.

* * * * *